United States Patent
Göbl

(10) Patent No.: US 9,530,712 B2
(45) Date of Patent: Dec. 27, 2016

(54) POWER ELECTRONIC SWITCHING DEVICE AND ASSEMBLY

(71) Applicant: Semikron Elektronik GmbH & Co., KG, Nürnberg (DE)

(72) Inventor: Christian Göbl, Nürnberg (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/120,385

(22) Filed: May 14, 2014

(65) Prior Publication Data

US 2015/0069599 A1 Mar. 12, 2015

(30) Foreign Application Priority Data

May 14, 2013 (DE) .................... 10 2013 104 949

(51) Int. Cl.
*H01L 23/367* (2006.01)
*H01L 23/433* (2006.01)
(Continued)

(52) U.S. Cl.
CPC ......... *H01L 23/367* (2013.01); *H01L 23/3107* (2013.01); *H01L 23/433* (2013.01);
(Continued)

(58) Field of Classification Search
CPC .. H01L 23/367; H01L 23/3107; H01L 23/433; H01L 24/72; H01L 25/072; H01L 23/3735; H01L 23/4985; H01L 2924/13091; H01L 2924/00; H01L 2924/13055
(Continued)

(56) References Cited

U.S. PATENT DOCUMENTS 5,267,867 A 12/1993 Agahdel
5,483,104 A * 1/1996 Godinho .......... H01L 21/76895
257/401
(Continued)

FOREIGN PATENT DOCUMENTS

DE 101 21 970 A1 11/2002
DE 101 21 970 B4 11/2002
(Continued)

OTHER PUBLICATIONS

Fisher R et al: 11 High frequency. lowcost. power packaging using thin film power overlay technology. Applied Power Electronics Conference and Exposition. 1995. APEC '95.
(Continued)

*Primary Examiner* — Alexander Oscar Williams
(74) *Attorney, Agent, or Firm* — The Law Offices of Roger S. Thompson

(57) ABSTRACT

A switching device having a substrate, a power semiconductor component, a connecting device, load connection devices and a pressure device. Substrate has electrically insulated conductor tracks. A power semiconductor component is arranged on a conductor track. Connecting device is formed as a film composite having an electrically conductive film and an electrically insulating film, and has first and second main surfaces. Switching device is connected in an internally circuit-conforming manner by connecting device. The pressure device has a pressure body with a first recess, a pressure element being arranged so that it projects out of the recess, wherein the pressure element presses onto a section of the second main surface of film composite and, in this case, the section is arranged within the surface of the power semiconductor component in projection along the normal direction of the power semiconductor component.

19 Claims, 4 Drawing Sheets

(51) Int. Cl.
  *H01L 23/31*  (2006.01)
  *H01L 23/00*  (2006.01)
  *H01L 25/07*  (2006.01)
  *H01L 23/373* (2006.01)
  *H01L 23/498* (2006.01)

(52) U.S. Cl.
  CPC ............ *H01L 24/72* (2013.01); *H01L 25/072* (2013.01); *H01L 23/3735* (2013.01); *H01L 23/4985* (2013.01); *H01L 2924/13055* (2013.01); *H01L 2924/13091* (2013.01)

(58) Field of Classification Search
  USPC .................. 257/719.773, 785, 774, E33.075, 257/E21.131, E23.051; 438/122
  See application file for complete search history.

(56) References Cited

U.S. PATENT DOCUMENTS

| | | | |
|---|---|---|---|
| 6,218,730 B1* | 4/2001 | Toy | H01L 23/10 257/704 |
| 6,881,071 B2* | 4/2005 | Heilbronner | H01L 23/051 257/E23.187 |
| 7,589,418 B2 | 9/2009 | Lederer | |
| 7,750,461 B2* | 7/2010 | Schulz-Harder | H01L 23/3735 257/177 |
| 8,134,837 B2* | 3/2012 | Hohlfeld | H01L 23/4006 165/104.33 |
| 8,975,711 B2* | 3/2015 | Otremba | H01L 25/071 257/401 |
| 9,036,327 B2* | 5/2015 | Konishi | B81B 3/0086 361/277 |
| 2004/0206534 A1* | 10/2004 | Lucke | H01L 23/15 174/535 |
| 2005/0127500 A1* | 6/2005 | Colgan | H01L 23/367 257/706 |
| 2005/0167849 A1* | 8/2005 | Sato | H01L 23/3121 257/778 |
| 2007/0227767 A1* | 10/2007 | Gobl | H01L 23/49822 174/261 |
| 2010/0133684 A1* | 6/2010 | Oka | H01L 21/565 257/712 |
| 2011/0279980 A1* | 11/2011 | Tsai | H05K 7/20963 361/710 |
| 2011/0309456 A1* | 12/2011 | Yamazaki | H01L 29/42384 257/411 |
| 2013/0176682 A1* | 7/2013 | Besendorfer | H01L 23/18 361/707 |
| 2013/0256856 A1* | 10/2013 | Mahler | H01L 21/76816 257/676 |
| 2014/0299982 A1* | 10/2014 | Minamio | H01L 25/162 257/712 |
| 2015/0325494 A1* | 11/2015 | Kroneder | H01L 23/3675 361/715 |

FOREIGN PATENT DOCUMENTS

| | | |
|---|---|---|
| DE | 10 2006 006 425 | 8/2007 |
| DE | 10 2007 006 706 | 12/2009 |
| DE | 10 2009 005 915 A1 | 8/2010 |
| DE | 10 2010 62 556 | 6/2012 |
| DE | 10 2010 062556 A1 | 6/2012 |
| DE | 102013104949 B3 * | 4/2014 |
| JP | 2000-68637 * | 3/2000 |
| JP | 3965795 B2 * | 8/2007 |

OTHER PUBLICATIONS

Conference Proceedings 1995 •• Tenth Annual Dallas TX. USA Mar. 5-9, 1995. New York. NY. USA. IEEE. US. (Mar. 5, 1995).
European Search Results in corresponding EP application (Oct. 10, 2014).

* cited by examiner

POWER ELECTRONIC SWITCHING DEVICE AND ASSEMBLY

BACKGROUND OF THE INVENTION

1. Field of the Invention

The invention relates to a power electronics switching device which can form a base cell of a power semiconductor module or of a power electronics system by the power electronics switching device alone or in combination with further, preferably identical, base cells forming the basic power electronics building block of the power semiconductor module or of the power electronics system.

2. Description of the Related Art

Known power semiconductor modules are shown, for example, in German Patent Application DE 10 2010 62 556 A1, in the form of a power semiconductor module in which a housing has pressure elements with a pressure body, wherein the pressure body presses either directly onto a portion of a semiconductor component or onto a section of a substrate. U.S. Pat. No. 7,808,100 B2 likewise discloses pressing directly onto power semiconductor components by a pressing ram. One disadvantage of these two devices is that direct pressure can be applied to a power semiconductor component, which is connected in an internally circuit-conforming manner by wire bonded connections, only in a highly selective manner due to the limited area available in real-world applications. Therefore, the current-carrying capacity of the internal connection is reduced, since no bonding connections can be established at the pressure point.

German Patent Application DE 10 2007 006 706 A1 describes a circuit arrangement having a substrate and conductor tracks arranged on the substrate, with semiconductor components arranged on the conductor tracks. According to this disclosure, an internal connecting device is formed as a film composite which connects a power semiconductor component to a contact area of a conductor track. In this case, an insulating material is arranged at the edge of the semiconductor component.

By way of further example, German Patent Application DE 10 2006 006 425 A1 discloses forming a power semiconductor module so that pressure devices, formed as load connection elements with a plurality of contact feet in each case, exert pressure on contact points of a substrate to establish thermally conductive contact between the substrate and a cooling device. However, one disadvantage of this arrangement is that, in spite of a plurality of contact feet which exert pressure, the thermal connection is not optimal since the thermal connection of the power semiconductor component which generates waste heat is made only indirectly.

SUMMARY OF THE INVENTION

The object of the invention is to provide an improved power electronics switching device which overcomes the drawbacks of the prior art.

It is a further object of the invention to provide a power electronics switching device and an arrangement comprising the same, wherein the switching device can be used in a versatile manner and, as a base cell, thereby offering improved and, preferably, optimal thermal pressure connection to a cooling device.

The inventive switching device is a power electronics switching device having a substrate, a power semiconductor component is arranged on the substrate, a connecting device, load connection devices and a pressure device, wherein the substrate has conductor tracks which are electrically insulated from one another and a power semiconductor component is arranged on a conductor track and is cohesively connected to the conductor track, wherein the connecting device is formed as a film composite having an electrically conductive film and an electrically insulating film, and therefore forms a first and a second main surface, and wherein the switching device is connected in an internally circuit-conforming manner by a connecting device, wherein the pressure device has a pressure body with a first recess, a pressure element being arranged such that it projects out of the recess, and wherein the pressure element presses onto a section of the second main surface of film composite and, in this case, the section is arranged within the surface of the power semiconductor component in projection along the normal direction of the power semiconductor component.

It goes without saying that the term "power semiconductor component" as used herein would be understood to include at least one power semiconductor component, wherein a plurality of power semiconductor components can be arranged on one or more conductor tracks.

In the inventive device, it is preferred that the recess in the pressure body is formed exclusively as a depression starting from a first main surface or as a depression starting from the first main surface with a cutout, which passes through the pressure body to the second main surface, with an opening arranged there. In this case, the pressure element can substantially completely fill the recess in the pressure body. As an alternative, at the same time or in addition, the pressure element can project out of the cutout in the pressure body at its second main surface.

In a particularly preferred embodiment, the pressure body can be composed of a high-temperature-resistant thermoplastic material, in particular polyphenylene sulphide, and the pressure element can be composed of a silicone rubber, in particular liquid silicone.

In order to form an efficient pressure device which, when it is loaded for the power semiconductor component, does not lead to destruction of the power semiconductor component, it is particularly advantageous when the surface area of the section is at least about 20%, most preferably at least about 50%, of the surface of the power semiconductor component.

Within the meaning of a base cell, it is further preferred when the lateral extent of the pressure device in the two orthogonal directions parallel to the substrate plane is smaller than the lateral extent of the substrate as such.

In order to provide particular protection against environmental influences, it may also be preferred that the top face of the substrate, including the conductor tracks of the substrate, the power semiconductor component and connecting device, be encapsulated in a moisture-tight manner by an encapsulation compound.

An arrangement having an above-described electronic switching device, having a cooling device and having a pressure introduction device is formed according to the invention, wherein the pressure introduction device is supported indirectly or directly against the cooling device, introduces pressure centrally onto the pressure device and, as a result, the switching device is connected in a force-fitting manner to the cooling device. In this case, a cooling device can be understood to mean, in particular, a base plate or preferably a heat sink.

Similarly, on account of the particularly effective introduction of pressure, it is possible for a thermally conductive paste to be arranged between the substrate, in particular that part of the substrate on which the power semiconductor components are arranged, and the cooling device. The paste preferably has a thickness of less than about 20 µm, more preferably of less than about 10 µm, and most preferably of less than about 5 µm.

It is particularly preferred when the ratio of the lateral extent to the vertical extent of the pressure body before the arrangement with a cooling device has a ratio of at least about 2 to 1, and more preferably of at least about 4 to 1, and after this arrangement, together with the accompanying application of pressure, has a ratio of at least about 3 to 1, and more preferably of at least about 5 to 1.

It goes without saying that the various embodiments of the invention can be realized individually or in any desired combinations in order to achieve improvements. In particular, the features mentioned and explained above can be used not only in the specified combinations, but also in other combinations or on their own, without departing from the scope of the present invention.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
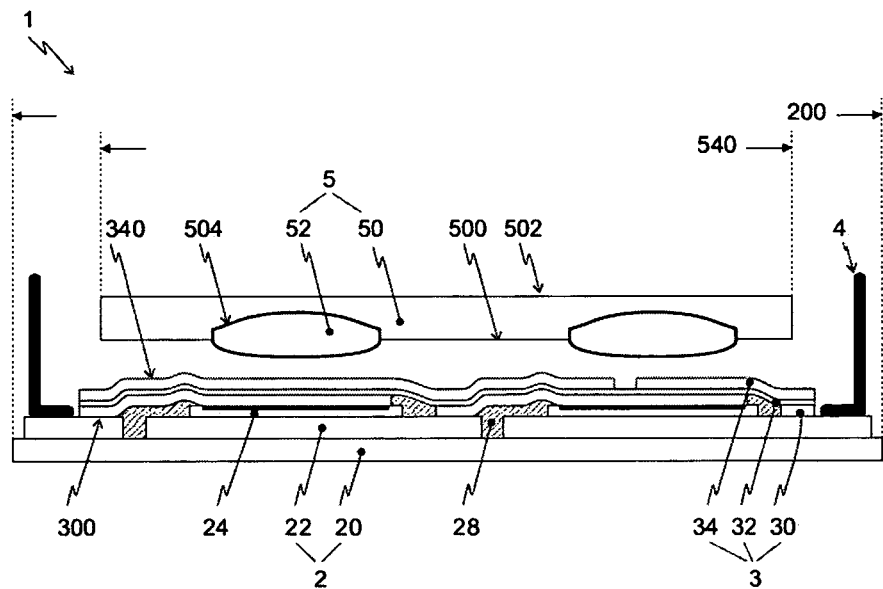
FIG. 1 shows a first embodiment of a power electronics switching device according to the invention.

FIG. 1 shows a first embodiment of a power electronics switching device 1 according to the invention. FIG. 1 shows a substrate 2 which is formed in a manner which is fundamentally routine in the art, having an insulating material body 20 and conductor tracks 22 which are arranged on insulating material body 20, are each electrically insulated from one another and have different potentials, in particular load potentials, but also auxiliary, in particular switching and measurement, potentials, of the switching device. Specifically, three conductor tracks 22 with load potentials as are typical for a half-bridge topology are illustrated here.

A respective power switch 24, which may be formed conventionally as an individual switch, for example as a MOSFET or as an IGBT with a power diode which is connected back-to-back in parallel, is arranged on two conductor tracks 22, the power switches being illustrated here. Power switches 24 are electrically conductively connected to conductor tracks 22 in conventional fashion, preferably by a sintered connection.

The internal connections of switching device 1 are formed by a connecting device 3 from a film composite which has, in an alternating manner, electrically conductive films 30, 34 and one or more electrically insulating films 32. In this case, film composite 3 has exactly two conductive films and one insulating film which is arranged between the conductive films. In this case, that surface of film composite 3 which faces substrate 2 forms a first main surface 300, whereas the surface opposite the substrate forms a second main surface 340. In particular, the conductive films 30, 34 of connecting device 3 are inherently patterned and therefore form conductor track sections which are electrically insulated from one another. These conductor track sections connect, in particular, the respective power semiconductor component 24, more precisely the contact areas of the power semiconductor component on that side which is averted from substrate 2, to conductor tracks 22 of substrate 2. In a preferred embodiment, the conductor track sections are cohesively connected to the contact areas by a sintered connection.

The connections between power semiconductor components 24 and between conductor tracks 22 of substrate 2 can also be formed in the same way. Particularly in the case of pressure-sintered connections, it is advantageous, as illustrated, to arrange an insulating compound 28 at the edge region of power semiconductor component 24. This insulating compound 28 can also be arranged in the intermediate spaces between conductor tracks 22.

For the purpose of electrical connection, power electronics switching device 1 has load connection elements 4 and auxiliary connection elements (not shown). Load connection element 4 are formed, purely by way of example, as shaped metal bodies which are cohesively connected, advantageously likewise connected by a sintered connection, to a conductor track 22 of substrate 2 by a contact foot. In principle, parts of connecting device 3 itself can also be formed as load connection elements or auxiliary connection elements. The auxiliary connection elements, such as gate or sensor connections, can otherwise be formed in any known manner.

As shown, a pressure device 5 has a first main surface 500 which faces substrate 2, and a second main surface 502, which is averted from substrate 2, and in this case is illustrated in a manner spaced apart from connecting device 3 for clarity of illustration. Pressure device 5 is composed of a pressure body 50 and a plurality of pressure elements 52, two of which are illustrated. Pressure body 50 is preferably of particularly rigid form so as to pass pressure which is thereto to pressure elements 52 in a homogeneous manner. To this end, and against the background of thermal loading during operation of switching device 1, pressure body 50 is composed of a high-temperature-resistant thermoplastic material, in particular of polyphenylene sulphide. Pressure elements 52 have to be able to exert a substantially constant pressure during operation and, in this case, in particular at different temperatures. To this end, pressure elements 52 are composed of a silicone rubber, preferably of a so-called liquid silicone.

In the two orthogonal directions parallel to the plane of substrate 1, pressure device 5 has a lateral extent 540 which is smaller than the associated lateral extent 200 of substrate 2 itself.

Figure 2:
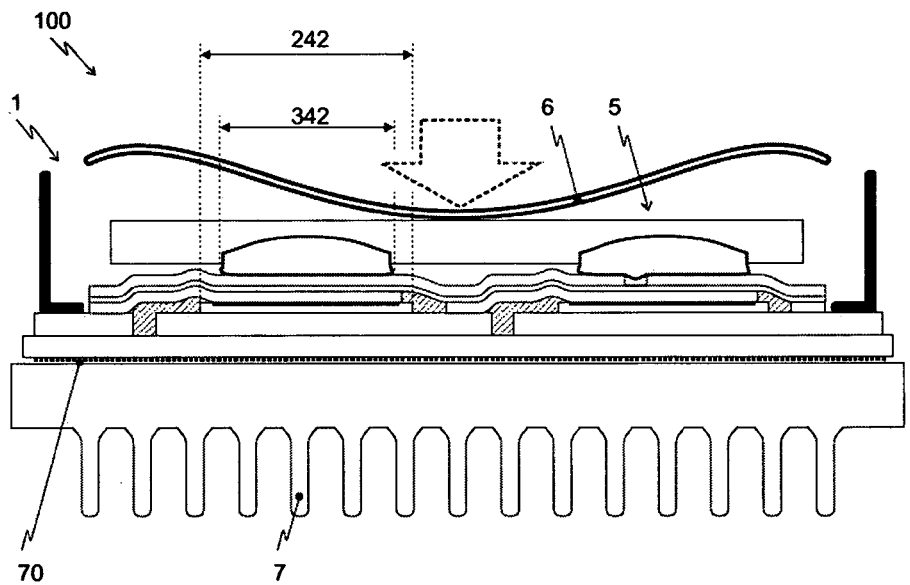
FIG. 2 shows the embodiment of FIG. 1 upon the application of pressure thereto.

FIG. 2 shows this first embodiment of an arrangement 100 according to the invention. Arrangement 100 has a first power electronics switching device 1 according to FIG. 1, and also a heat sink, which forms a cooling device 7, and a schematically indicated pressure introduction device 6.

Pressure introduction device 6 is supported, in a manner not illustrated, against the cooling device 7. This support can be performed either directly or indirectly, for example by a screw connection between pressure introduction device 6 and a housing which is attached to the cooling device.

In this case, the pressure introduction device 6 presses centrally onto pressure device 5 of switching device 1. Pressure body 50 of pressure device 5 distributes the applied pressure uniformly between pressure elements 52 which, for their part, press on sections 342 of second main surface 340 of connecting device 3. Sections 342 of connecting device 3, to which pressure is applied, are selected according to the invention so that they, and therefore the areas of extent thereof, are arranged, as viewed in the normal direction of the associated power semiconductor component 24, within the surface of the power semiconductor component 24. Therefore, pressure element 52 presses onto the power semiconductor component 24 by connecting device 3 so that the power semiconductor component, more precisely substrate 2 which is located beneath power semiconductor component 24, is pressed onto heat sink 7 and therefore the thermal contact from the power semiconductor component 24 to heat sink 7 is optimized.

Owing to this introduction of pressure onto pressure elements 52, pressure elements 52 deform, wherein it is also possible in this case for the lateral extent 342 of pressure elements 52 to increase. In the load-free state, that is to say, without pressure being introduced, cf. FIG. 1, pressure body 52 has a ratio of its lateral extent 520 to its vertical extent 522 of at least about 4 to 1, cf. the information given in relation to the dimensions in FIG. 4. This ratio changes to at least about 5 to 1 in the loaded state, that is to say in the state in which pressure is applied, and owing to the resulting deformation of the pressure body 52 according to FIG. 2.

A thermally conductive paste 70 may preferably be arranged between substrate 2 and heat sink 7 with a thickness of less than about 10 μm, preferably less than about 5 μm. A thin thermally conductive paste layer 70 of this kind is possible, taking into account latent local sagging of substrate 2, in particular owing to the pressure being introduced onto the power semiconductor component 24 in the normal direction, and therefore power semiconductor component 24, and not a surrounding area, being in optimal thermal contact with heat sink 7.

In this embodiment, the cooling device is illustrated as a heat sink 7 for air cooling, but can equally be formed as a base plate of a power semiconductor module or as a heat sink for liquid cooling.

Figure 3:
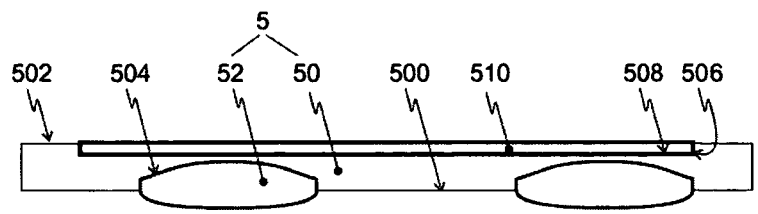
FIG. 3 shows a pressure device of a second embodiment of the inventive power electronics switching device.

FIG. 3 shows a pressure device 5 of a second embodiment of a power electronics switching device. The pressure body 50 of pressure device 5 additionally has a metal insert 510 which in this case is arranged, without restricting the generality, in a second recess 506 in the second main surface 504 of pressure device 5. In this case, the base of second recess 506 forms an auxiliary surface 508 which delimits pressure body 50.

Figure 4:
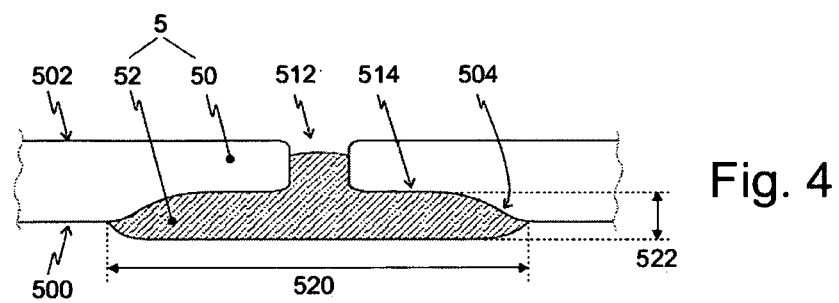
FIGS. 4 to 6 show various embodiments of parts of the inventive pressure device.
Figure 5:
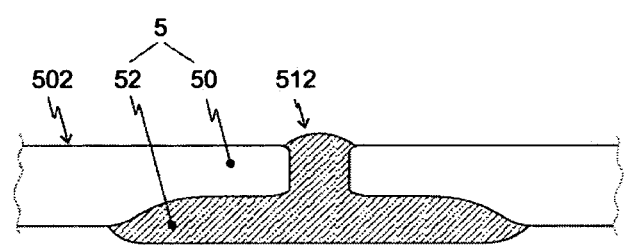
Figure 6:
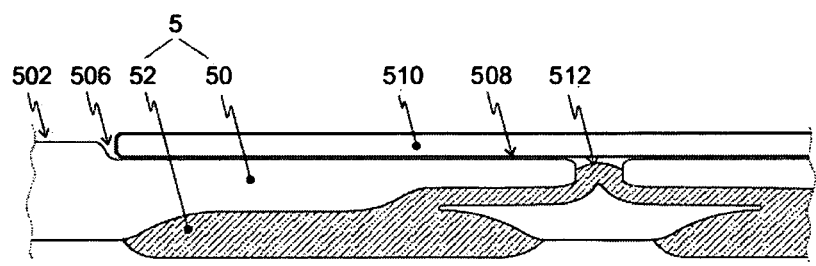

FIGS. 4 to 6 show different embodiments of parts of the pressure device, in particular a section of the pressure body with a pressure element, or, in the case of FIG. 6, with two pressure elements.

FIG. 4 shows a pressure body 50 with a first recess 504 which starts from the first main surface 500 and which is formed not only as a depression, as in the case of the pressure device according to FIG. 1, but also as a depression with a cutout 504 and an opening in the second main surface 502 of pressure body 50, which opening extends from the first main surface 500 to second main surface 502. In this case, it is true for this and all other cutouts 504 of this kind that, in each case viewed one-dimensionally, their clear width at the first main surface 500 corresponds to at least five times, usually at least ten times, the clear width at the second main surface 502, even if this is not shown in the schematic illustration.

The said clear width at first main surface 500 is identical to the lateral extent 520 of pressure element 52, whereas the vertical extent 522 of pressure element 52 extends as far as the base 514 of first recess 504, but not into the opening 512 to the second main surface 502 of the pressure body 52.

The lateral extent 520 of pressure element 52 after pressure is applied corresponds to the lateral extent of that section 342 of connecting element 3 which is in contact with pressure element 52, cf. FIG. 2.

In this case, pressure element 52 is composed of a so-called liquid silicone, also known as liquid silicone rubber (LSR), with a Shore A hardness of 20 to 70, preferably of from about 30 to about 40. This is arranged within pressure body 50, which is composed of polyphenylene sulphide, by a two-component injection molding process. To this end, the liquid silicone can be introduced through opening 512 in second main surface 502 of pressure body 50. In this embodiment of pressure device 5, cutout 504 in pressure body 50 is not completely filled with liquid silicone, as a result of which it does not reach as far as the plane which is defined by the second main surface 502 of pressure device 5.

FIG. 5 shows a slightly modified embodiment of pressure device 5 according to FIG. 4. In this case, cutout 504 in pressure body 50 is completely filled with liquid silicone. The liquid silicone extends beyond the plane which is defined by second main surface 502 of pressure device 5 and protrudes therefrom.

FIG. 6 shows a further modification of pressure device 5, wherein pressure device 5 has a metal core 510 analogous to the embodiment shown in FIG. 3. In addition, cutouts 504 here in second pressure elements 52, generally in a plurality of pressure elements, are connected to one another within pressure body 50 and have a common opening 512 which is directed toward auxiliary surface 508 in this case. Within the scope of the production method of pressure device 5, the liquid silicone is introduced into pressure body 50 through opening 512.

Figure 7A:
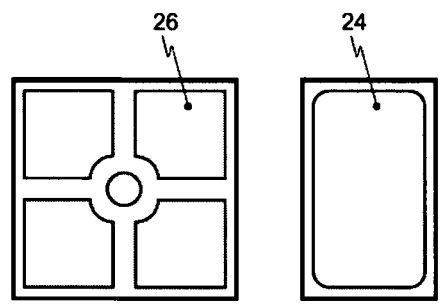
FIGS. 7a-d shows plan views of the inventive power electronics switching device in various sectional planes.

FIGS. 7a-d shows a plan view of a power electronics switching device 1 in different sectional planes. The sectional plane according to FIG. 7a shows two power semiconductor components 24, 26 which are, however, typically arranged, in a manner not illustrated, on a common conductor track of a substrate. Without restricting the generality, the power semiconductor components are in this case a transistor 26 with a central gate connection area and emitter connection areas which surround the gate connection area, and a diode 24 with a cathode connection area.

Figure 7B:
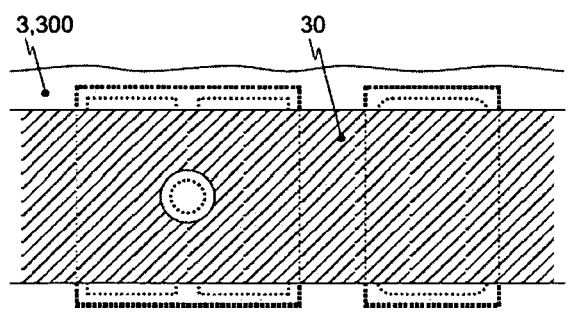

FIG. 7b shows the first inherently patterned electrically conductive film 30 of connecting device 3. Film 30 forms an electrically conductive connection between the emitter connection areas of transistor 26 and the cathode connection area of diode 24. In this case, the gate connection area of the transistor 26 is cut out.

Figure 7C:
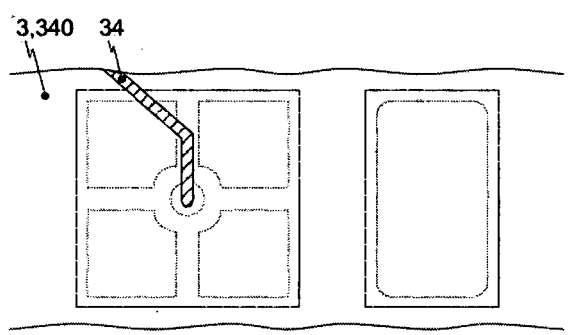

FIG. 7c shows the second inherently patterned electrically conductive film 34 of connecting device 3. Film 34 forms an electrically conductive connection to the gate connection area of the transistor 26.

Figure 7D:
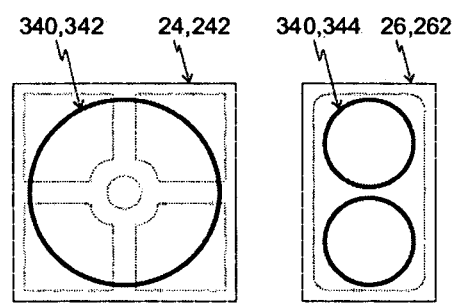

FIG. 7d branches, as it were, the footprint of the contact elements, which are associated with the power semiconductor components 24, 26, of the contact device, wherein only one contact element is associated with the transistor on account of its square basic shape, and two contact elements are associated with the diode on account of its rectangular basic shape. The respective footprint corresponds to those sections 342, 344 on the second main surface 304 of connecting device 3 which are arranged in alignment in the normal direction to form the power semiconductor components, and in this case are projected onto the respective power semiconductor component. It is clear here that the area of the footprint, that is to say that area which is intended for introducing pressure, covers as large a portion of the area of the power semiconductor component as possible, without going beyond this.

Figure 8:
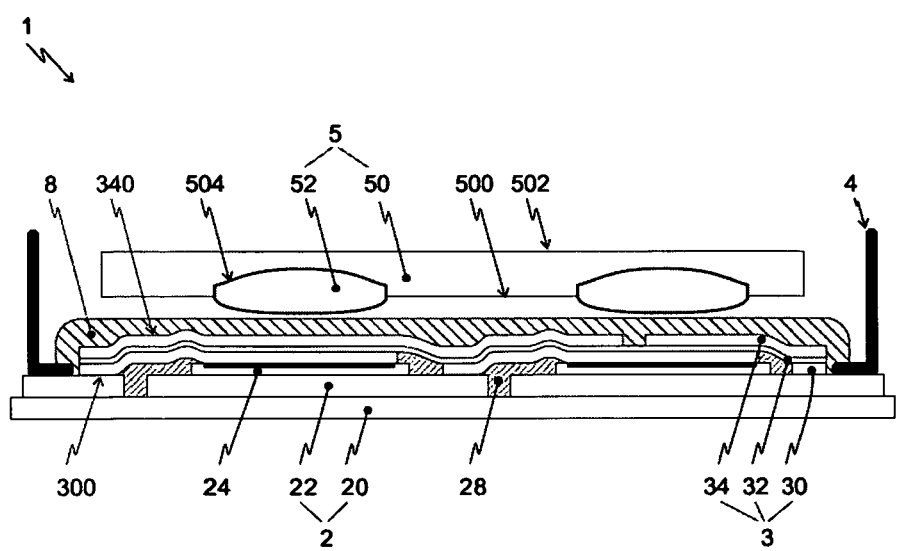
FIG. 8 shows a second embodiment of a power electronics switching device according to the invention.

FIG. 8 shows a second embodiment of a power electronics switching device 1 according to the invention which is a development of the first embodiment according to FIG. 1. In this case, in order to meet the requirements for protecting against environmental influences, the top face of substrate 2, including its conductor tracks 22, the power semiconductor components 24 and connecting device 3, is encapsulated in a moisture-tight manner by an encapsulation compound 8, for example an epoxy resin. Protection with an IP 54 (International protection code according to IEC 60529) rating and higher can be achieved as a result. In this case, parts of the connection elements, in particular of load connection elements 4, are advantageously also encapsulated.

In the preceding Detailed Description, reference was made to the accompanying drawings, which form a part of his disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power electronics switching device comprising:
   a substrate;
   a power semiconductor component disposed on said substrate;
   a connecting device;
   load connection devices; and
   a pressure device;
   wherein said substrate has conductor tracks which are electrically insulated from one another, and the power semiconductor component is disposed on one of said conductor tracks and is cohesively connected to said one of said conductor tracks;
   wherein said connecting device is formed as a film composite having at least one electrically conductive film and an electrically insulating film, and therefore forms a first and a second main surface;
   wherein said switching device is connected in an internally circuit-conforming manner by said connecting device;
   wherein said pressure device has a pressure body with a first recess, a pressure element disposed such that it projects out of said recess; and
   wherein said pressure element presses onto a section of said second main surface of said film composite and, whereby said section is disposed within said surface of said power semiconductor component in projection along the normal direction of said power semiconductor component;
   wherein said first recess in said pressure body is formed as a depression starting from a first main surface of said pressure body with a cutout, which passes through said pressure body to a second main surface of said pressure body, with an opening formed therein;
   wherein said pressure element projects out of said cutout in said pressure body at its second main surface.

2. The switching device of claim 1, wherein said pressure element substantially completely fills said first recess in said pressure body.

3. The switching device of claim 1, wherein said pressure body is composed of a high-temperature-resistant thermoplastic material and said pressure element is composed of a silicone rubber.

4. The switching device of claim 3, wherein said pressure body is composed of polyphenylene sulphide, and said pressure element is composed of liquid silicone.

5. The switching device of claim 1
   wherein said pressure body has a second recess on its second main surface, the base of said second recess forming an auxiliary surface; and
   wherein a flat metal body is disposed in said second recess.

6. The switching device of claim 1, wherein the surface area of said section of said second main surface is at least about 20% of the surface area of said power semiconductor component.

7. The switching device of claim 6, wherein the surface area of said section of said second main surface is at least about 50% of the surface area of said power semiconductor component.

8. The switching device of claim 1, wherein said electrically conductive film of said connecting device includes second conductor tracks having first sections which are cohesively connected both to a contact area of said power semiconductor component and to one of said conductor tracks of said substrate.

9. The switching device of claim 1, wherein the lateral extent of said pressure device in a direction orthogonal to a direction parallel to the plane of said substrate is smaller than the lateral extent of said substrate.

10. The switching device of claim 1, wherein the ratio of the lateral extent to vertical extent of said pressure body is at least about 2 to 1.

11. The switching device of claim 10, wherein the ratio of the lateral extent to vertical extent of said pressure body is at least about 4 to 1.

12. The switching device of claim 1, wherein the top face of said substrate, including said conductor tracks of said substrate, said power semiconductor component and said connecting device, is encapsulated in a moisture-tight manner by an encapsulation compound.

13. An electronic device comprising:
a power electronics switching device having:
   a substrate;
   a power semiconductor component disposed on said substrate;
   a connecting device;
   load connection devices; and
   a pressure device;
   wherein said substrate has conductor tracks which are electrically insulated from one another, and the power semiconductor component is disposed on one of said conductor tracks and is cohesively connected to said one of said conductor tracks;
   wherein said connecting device is formed as a film composite having at least one electrically conductive film and an electrically insulating film, and therefore forms a first and a second main surface;
   wherein said switching device is connected in an internally circuit-conforming manner by said connecting device;
   wherein said pressure device has a pressure body with a first recess, a pressure element disposed such that it projects out of said recess;
   wherein said first recess in said pressure body is formed as a depression starting from a first main surface of said pressure body with a cutout, which passes through said pressure body to a second main surface of said pressure body, with an opening formed therein;
   wherein said pressure element projects out of said cutout in said pressure body at its second main surface; and
   wherein said pressure element presses onto a section of said second main surface of said film composite and, whereby said section is disposed within said surface of said power semiconductor component in projection along the normal direction of said power semiconductor component;
a cooling device; and
a pressure introduction device;
wherein said pressure introduction device is supported against said cooling device, introduces pressure centrally onto said pressure device whereby said switching device is connected in a force-fitting manner to said cooling device.

14. The device of claim 13, wherein a thermally conductive paste is disposed between said substrate and said cooling device at a thickness of less than about 20 μm, in particular of less than 10 μm, in particular of less than 5 μm.

15. The device of claim 14, wherein said thickness of said thermally conductive paste is less than about 10 μm.

16. The device of claim 15, wherein said thickness of said thermally conductive paste is less than about 5 μm.

17. The device of claim 13, wherein said cooling device is one of the group consisting of a base plate of a power semiconductor module and a heat sink.

18. The device of claim 13, wherein the ratio of the lateral extent to the vertical extent of said pressure body is at least about 3 to 1.

19. The device of claim 18, wherein the ratio of the lateral extent to the vertical extent of said pressure body is at least about 5 to 1.

* * * * *